US006788989B2

(12) United States Patent
Kodama

(10) Patent No.: US 6,788,989 B2
(45) Date of Patent: Sep. 7, 2004

(54) ELECTRIC-CIRCUIT BOARD ASSEMBLING LINE, ELECTRIC-CIRCUIT BOARD PRODUCING METHOD AND ELECTRIC-CIRCUIT BOARD ASSEMBLING LINE CONTROLLING PROGRAM

(75) Inventor: Seigo Kodama, Yatomi-cho (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 0 days.

(21) Appl. No.: 10/134,604

(22) Filed: Apr. 30, 2002

(65) Prior Publication Data

US 2002/0166225 A1 Nov. 14, 2002

(30) Foreign Application Priority Data

May 9, 2001 (JP) ........................................ 2001-138255

(51) Int. Cl.[7] ........................... G05B 19/18; G06F 19/00
(52) U.S. Cl. ........................................ 700/117; 700/3
(58) Field of Search ............................ 700/90, 95, 117, 700/121, 3; 228/33

(56) References Cited

U.S. PATENT DOCUMENTS

| 5,692,292 A | * | 12/1997 | Asai et al. .................... 29/740 |
| 5,822,210 A | * | 10/1998 | Kobayashi et al. .......... 700/121 |
| 5,930,140 A | * | 7/1999 | Asai et al. ................... 700/121 |
| 5,941,444 A | * | 8/1999 | Sadler et al. ................. 228/33 |
| 6,230,067 B1 | * | 5/2001 | White ......................... 700/112 |

FOREIGN PATENT DOCUMENTS

JP A 2000-49498 2/2000

* cited by examiner

*Primary Examiner*—Leo Picard
*Assistant Examiner*—Ryan Jarrett
(74) *Attorney, Agent, or Firm*—Oliff & Berridge, PLC

(57) ABSTRACT

An electric-circuit-board assembling line includes multiple electric-component mounters which include respective control devices independent of each other and which are connected to each other via a network. Each control device can operate as each of a master control device and a slave control device. The master control device is operable to control the mounter including the slave control device. The master control device supplies, to the slave control device, information about an electric-circuit board to be assembled. The slave control device supplies, to the master control device, information about a state of the mounter including the slave control device, so that the master control device recognizes the state. An operator can designate the control device which has been operated as the slave control device to be a new master control device, and designate the remaining control devices to be new slave control devices.

13 Claims, 6 Drawing Sheets

ELECTRIC-CIRCUIT BOARD ASSEMBLING LINE, ELECTRIC-CIRCUIT BOARD PRODUCING METHOD AND ELECTRIC-CIRCUIT BOARD ASSEMBLING LINE CONTROLLING PROGRAM

BACKGROUND OF THE INVENTION

1. Field of the Invention

The present invention relates to an electric-circuit board assembling line for assembling an electric-circuit board by mounting an electric component (e.g., an electronic component) on a circuit-support board; an electric-circuit board producing method; and an electric-circuit board assembling line controlling program.

2. Discussion of Related Art

There is known an electric-circuit board assembling line in which a plurality of electric-circuit-board-assembling-related devices are arranged and each of the devices performs an electric-circuit-board-assembling-related step that is related to an operation in which an electric-circuit board is assembled by mounting an electric component on a circuit-support board. In this assembling line, usually, the assembling-related devices are provided with respective control devices that are independent of each other, and accordingly it has been a conventional practice that the assembling-related devices are operated, by an operator, independent of each other. For example, when the assembling line is started, respective start/stop switches of the assembling-related devices are turned ON by the operator. Likewise, when the operation of the assembling line is ended, the respective start/stop switches of the devices are turned OFF by the operator. This is true with all the other operations of the assembling-related devices, that is, the operator must operate the individual devices independent of each other, which complicates the management of the assembling line and lowers the efficiency of management of the operator.

SUMMARY OF THE INVENTION

It is therefore an object of the present invention to simplify management of an electric-circuit board assembling line and improve efficiency with which an operator manages the assembling line. This object may be achieved according to any one of the following numbered modes of the present invention in the form of an electric-circuit board assembling, an electric-circuit board producing method, and an electric-circuit board assembling line controlling program, each of which may depend from the other mode or modes, where appropriate, to indicate and clarify possible combinations of technical features. It is, however, to be understood that the present invention is not limited to the technical features or any combinations thereof that will be described below for illustrative purposes only. It is to be further understood that a plurality of elements or features included in any one of the following modes of the invention are not necessarily provided altogether, and that the invention may be embodied without some of the elements or features described with respect to the same mode.

(1) An electric-circuit board assembling line, comprising:

a plurality of electric-circuit-board-assembling-related apparatuses which include respective control devices independent of each other and which perform respective electric-circuit-board-assembling-related operations that are related to assembling of an electric-circuit board including a substrate board and at least one electric component mounted thereon, the respective control devices of the electric-circuit-board-assembling-related apparatuses including a master control device, and at least one slave control device subject to the master control device;

at least one communication device which connects the master control device and the slave control device, to each other; and at least one of (a) the master control device being operable to control the electric-circuit-board-assembling-related apparatus including the slave control device, (b) the master control device supplying, to the slave control device, information about the electric-circuit board to be assembled, and (c) the slave control device supplying, to the master control device, information about a state of the electric-circuit-board-assembling-related apparatus including the slave control device, so that the master control device recognizes the state.

According to this mode, the master control device and the slave control device are connected to each other by the communication device. If the master control device can be operated by an operator to control the slave control device, the operator need not move to the place where the slave control device is located. In addition, if the master control device can supply, to the slave control device, information about the electric-circuit board to be assembled, the operator need not input the information to the slave control device. Moreover, if the slave control device can supply, to the master control device, information about a state of the assembling-related apparatus including the slave control device, so that the master control device can recognize the state, the assembling line as a whole can be easily controlled. In the last case, the operator working at the place where the master control device is located can recognize the state of the assembling-related apparatus including the slave control device, whereby the operator can easily monitor the assembling line. If at least one of the above-indicated features (a), (b), (c) is employed, the assembling line can be more easily used. And, if all those features (a), (b), (c) are employed, the operator can operate, without needing to move away from the master control device, the assembling line as a whole, input control information to the assembling line, and monitor the assembling line, whereby the assembling line can be most easily used. In addition, if the master control device is arranged to automatically monitor and/or control the slave control device, the plurality of assembling-related apparatuses can be controlled in cooperation with each other, so that the production efficiency of the assembling line can be improved.

(2) An electric-circuit board assembling line according to the mode (1), wherein the slave control device as a first slave control device is capable of operating as a second master control device, and the master control device as a first master control device is capable of operating as a second slave control device subject to the second master control device.

According to this mode, if the master control device as a first master control device has failed, the slave control device as a first slave control device can be operated as a second master control device, so as to continue the electric-circuit-board-assembling-related operations. In addition, in the case where the operator is required, for some reason, to stay with a specific one of the respective control devices of the assembling-related apparatuses, the specific control device can be operated as the master control device so as to monitor the assembling line as a whole. Assembling of a specific sort of electric-circuit board may not need operation of a specific sort of assembling-related apparatus. If the control device of that assembling-related apparatus has been operated as the master control device, the control device of another assembling-related apparatus may be newly operated as a master control device.

(3) An electric-circuit board assembling line according to the mode (2), wherein each of the respective control devices of the electric-circuit-board-assembling-related apparatuses is capable of operating as each of a master control device and a slave control device.

The present electric-circuit board assembling line can enjoy a very high degree of freedom.

(4) An electric-circuit board assembling line according to any of the modes (1) to (3), wherein each one of the respective control devices of the electric-circuit-board-assembling-related apparatuses performs a plurality of operations identical with a plurality of operations that are performed by each of the other control devices of the electric-circuit-board-assembling-related apparatuses.

According to this mode, any of the respective control devices of the assembling-related apparatuses can be operated as a master control device, and the remaining control devices can all be operated as slave control devices. Thus, a degree of freedom of use of the assembling line is improved. In addition, the master control device and the slave control device can be more easily exchanged with each other.

(5) An electric-circuit board assembling line according to any of the modes (1) to (4), wherein each of the electric-circuit-board-assembling-related apparatuses comprises an electric-component mounting device which mounts at least one electric component on the substrate board.

(6) An electric-circuit board assembling line according to any of the modes (1) to (5), wherein the slave control device supplies, to the master control device, information about a state of the electric-circuit-board-assembling-related apparatus including the slave control device, and the master control device controls, based on the supplied information, the electric-circuit-board-assembling-related apparatus including the master control device and the electric-circuit-board-assembling-related apparatus including the slave control device.

According to this mode, for example, when the assembling-related apparatus including the slave control device has failed to mount an electric component on the substrate board, thereby producing a defective substrate board, the master control device can do at least one of (a) inhibiting one or more assembling-related apparatuses located downstream of the apparatus in question, from performing respective assembling-related operations on the defective board and (b) commanding one or more assembling-related apparatuses located upstream of the apparatus in question, to perform respective assembling-related operations on one more substrate board. In addition, when an assembling-related apparatus including a slave control device has become unable to supply a specific sort of electric components, the master control device tries to find an assembling-related apparatus able to supply that sort of electric components, and control a slave control device of that assembling-related apparatus to supply that sort of electric components.

(7) An electric-circuit board assembling line according to any of the modes (1) to (6), wherein the master control device supplies, to the slave control device, information about the substrate board.

According to this mode, in the case where the assembling line employs a plurality of slave control devices, the master control device directly supplies the information about the substrate board, to each of the slave control devices.

(8) An electric-circuit board assembling line according to any of the modes (1) to (6), wherein the respective control devices of the electric-circuit-board-assembling-related apparatuses include at least two slave control devices subject to the master control device, and wherein the master control device supplies, to one of the two slave control devices, information about the substrate board, and the one slave control device supplies, to the other slave control device, the information about the substrate board.

According to this mode, in the case where the assembling line employs three slave control devices, the master control device indirectly supplies the information about the substrate board, to the third or last one of the three slave control devices via the intermediate two slave control devices.

(9) A method of assembling an electric-circuit board with an electric-circuit board assembling line including a plurality of electric-circuit-board-assembling-related apparatuses which include respective control devices independent of each other and which perform respective electric-circuit-board-assembling-related operations that are related to assembling of an electric-circuit board including a circuit-support board and at least one electric component mounted thereon, the method comprising the steps of:

operating a first one of the respective control devices of the electric-circuit-board-assembling-related apparatuses as a master control device, and operating at least one second one of the respective control devices as at least one slave control device subject to the master control device, and at least one of (a) operating the master control device to control the electric-circuit-board-assembling-related apparatus including the slave control device, (b) supplying, from the master control device to the slave control device, information about the electric-circuit board to be assembled, and (c) supplying, from the slave control device to the master control device, information about a state of the electric-circuit-board-assembling-related apparatus including the slave control device, so that the master control device recognizes the state.

The present electric-circuit-board assembling method may be modified according to any of the modes (2) to (8).

(10) An electric-circuit board assembling line controlling program which is executed by a computer to control an electric-circuit board assembling line including a plurality of electric-circuit-board-assembling-related apparatuses which include respective control devices independent of each other and which perform respective electric-circuit-board-assembling-related operations that are related to assembling of an electric-circuit board including a substrate board and at least one electric component mounted thereon, the program comprising:

a master-control-device operating portion for operating a first one of the respective control devices of the electric-circuit-board-assembling-related apparatuses, as a master control device, and a slave-control-device operating portion for operating at least one second one of the respective control devices of the electric-circuit-board-assembling-related apparatuses, as at least one slave control device subject to the master control device, for at least one of (a) operating the master control device to control the electric-circuit-board-assembling-related apparatus including the slave control device, (b) supplying, from the master control device to the slave control device, information about the electric-circuit board to be assembled, and (c) supplying, from the slave control device to the master control device, information about a state of the electric-circuit-board-assembling-related apparatus including the slave control device, so that the master control device recognizes the state.

The present electric-circuit board assembling line controlling program may be modified according to any of the modes (2) to (8).

(11) An electric-circuit board assembling line controlling program according to the mode (10), wherein the master-control-device operating portion is capable of operating each one of the respective control devices of the electric-circuit-board-assembling-related apparatuses, as a master control device, and the slave-control-device operating portion is capable of operating the each one of the respective control devices as a slave control device subject to the master control device.

(12) A recording medium for recording an electric-circuit board assembling line controlling program such that the program is readable by a computer to control an electric-circuit board assembling line including a plurality of electric-circuit-board-assembling-related apparatuses which include respective control devices independent of each other and which perform respective electric-circuit-board-assembling-related operations that are related to assembling of an electric-circuit board including a substrate board and at least one electric component mounted thereon, the program comprising:

a master-control-device operating portion for operating a first one of the respective control devices of the electric-circuit-board-assembling-related apparatuses, as a master control device, and a slave-control-device operating portion for operating at least one second one of the respective control devices of the electric-circuit-board-assembling-related apparatuses, as at least one slave control device subject to the master control device, for at least one of (a) operating the master control device to control the electric-circuit-board-assembling-related apparatus including the slave control device, (b) supplying, from the master control device to the slave control device, information about the electric-circuit board to be assembled, and (c) supplying, from the slave control device to the master control device, information about a state of the electric-circuit-board-assembling-related apparatus including the slave control device, so that the master control device recognizes the state.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which.

DETAILED DESCRIPTION OF THE PREFERRED EMBODIMENTS

Hereinafter, there will be described in detail an electric-circuit board assembling line to which the present invention is applied, by reference to the drawings. The present electric-circuit board assembling line is used to carry out an electric-circuit board assembling method to which the present invention is also applied.

Figure 6:
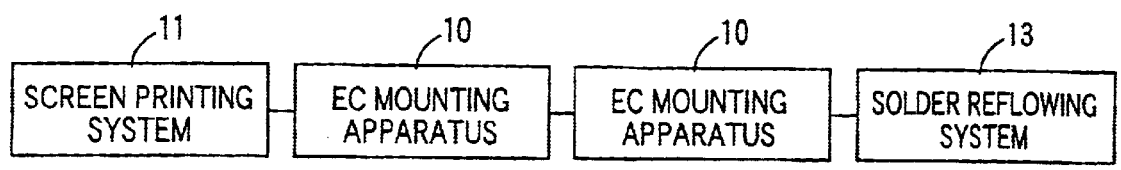
FIG. 6 is a view of the electric-circuit board assembling line.

The present assembling line includes a plurality of electric-component (EC) mounting apparatuses 10 which are arranged in a conveying direction in which a substrate board in the form of a printed wiring board is conveyed. One of the EC mounting apparatuses 10 is shown as a representative thereof, in FIG. 1. The EC mounting apparatuses 10 cooperate with each other to convey each substrate board in the conveying direction, and sequentially mount respective electric components on the printed wiring board, thereby producing an electric-circuit board in the form of a printed circuit board. As shown in FIG. 6, the present assembling line includes, in addition to the EC mounting apparatuses 10, a screen printing system 11 as an upstream-side apparatus provided on an upstream side of the most upstream EC mounting apparatus 10 in the conveying direction, and a solder reflowing system 13 as a downstream-side apparatus provided on a downstream side of the most downstream EC mounting system 10. The screen printing system 11 is a sort of solder applying system which applies solder paste to the printed wiring board, that is, prints the solder paste on the wiring board. The solder reflowing system 13 reflows or melts the solder paste printed on the printed wiring board, thereby electrically connecting the electric components to the wiring board.

Figure 1:
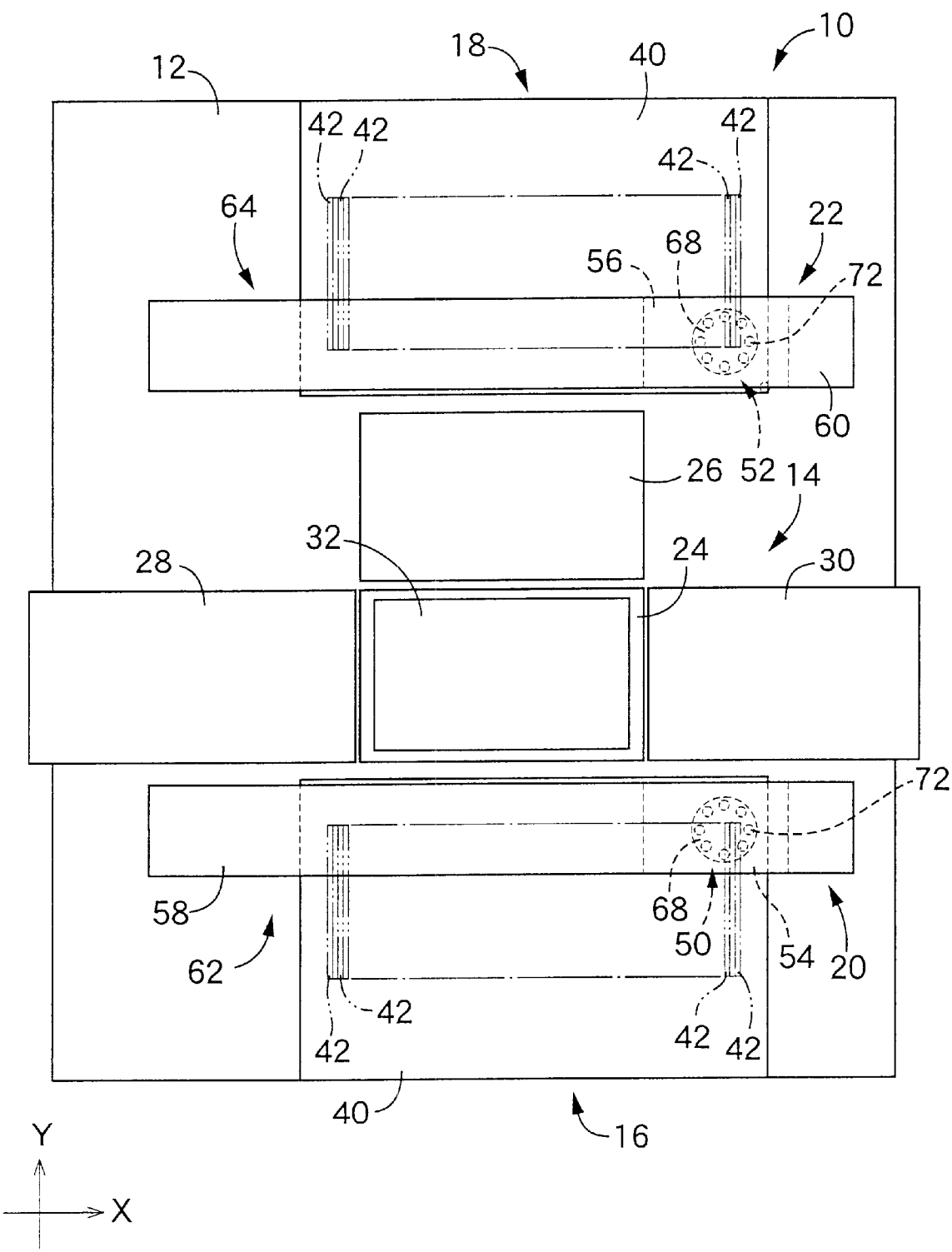
FIG. 1 is a plan view schematically showing an electronic-component mounting system as part of an electric-circuit board assembling line according to one embodiment of this invention.

The EC mounting apparatus 10 will be described below. In FIG. 1, reference numeral 12 designates a base on which a board conveying device 14, two EC supplying devices 16, 18, and the two EC transferring and mounting devices 20, 22 are provided. The board conveying device 14 includes two main conveyors 24, 26, a single carry-in conveyor 28, and a single carry-out conveyor 30. The two main conveyors 24, 26 include respective board positioning and supporting devices each of which positions and supports a substrate board in the form of a printed wiring board (PWB) 32, and are juxtaposed, that is, arranged side by side, in a direction (i.e., a Y-axis direction) which is perpendicular, on a horizontal plane, to a direction (i.e., an X-axis direction) in which the PWB 32 is conveyed. The X-axis direction will be referred as the conveying direction, if appropriate. The X-axis direction, i.e., the conveying direction is a direction from the left-hand side toward the right-hand side in FIG. 1. The carry-in conveyor 28 is provided on the upstream side of the main conveyors 24, 26 in the conveying direction, and is shifted by a carry-in-conveyor shifting device (not shown) to a first shift position where the carry-in conveyor 28 is aligned with the first main conveyor 24 and to a second shift position where the carry-in conveyor 28 is aligned with the second main conveyor 26. The carry-in conveyor 28, if it is one employed in the most upstream EC mounting apparatus 10, receives, from the screen printing system, the PWB 32 on which the solder paste has been printed by the printing system, and carries in the PWB 32 onto the first or second main conveyor 24, 26. If the carry-in conveyor 28 is one employed in any other EC mounting apparatus 10, the carry-in conveyor 28 receives, from another EC mounting apparatus 10 provided upstream thereof, the PWB 32 on which part of the electric components have been mounted, and carries in the PWB 32 onto the first or second main conveyor 24, 26. The carry-out conveyor 30 is provided on the downstream side of the main conveyors 24, 26 in the conveying direction, and is shifted by a carry-out-conveyor shifting device (not shown) to a first shift position where the carry-out conveyor 30 is aligned with the first main conveyor 24 and to a second shift position where the carry-out conveyor 30 is aligned with the second main conveyor 26. The carry-out conveyor 30, if it is one employed in the most downstream EC mounting apparatus 10, receives, from the first or second main conveyor 24, 26, the PCB 32 on which all the ECs have been mounted by the EC mounting apparatuses 10, i.e., an electric-circuit board in the form of a printed circuit board, and carries out the printed circuit board to the paste reflowing system. If the carry-out conveyor 30 is one employed in any other EC mounting apparatus 10, the carry-out conveyor 30 receives, from another EC mounting apparatus 10 provided upstream thereof, the PWB 32 on which part of the electric components have been mounted, and carries out the PWB 32 to another EC mounting apparatus 10 located downstream thereof.

Each of the EC supplying devices 16, 18 includes a plurality of EC feeders 42 each of which is detachably attached to a feeder-support table 40. Each of the EC feeders 42 includes a tape feeding device which feeds a plurality of ECs in the form of an EC carrier tape and supplies the ECs one by one to an EC-supply portion of the each feeder 42. The plurality of EC feeders 42 are attached to the feeder-support table 40 such that the respective EC-supply portions of the EC feeders 42 are arranged along a straight line parallel to the X-axis direction.

The EC mounting apparatuses 10 include respective EC mounting heads 50, 52, and respective X-Y robots 62, 64 which include respective X-axis slides 54, 56 and respective Y-axis slides 58, 60 and which move the respective EC mounting heads 50, 52 to respective arbitrary positions on the horizontal plane. Since the two EC mounting heads 50, 52 have the same construction and the two X-Y robots 62, 64 have the same construction, only the EC mounting head 50 and the X-Y robot 62 will be described below.

The Y-axis slide 58 is provided on the base 12 such that the Y-axis slide 58 is movable in the Y-axis direction, and the X-axis slide 54 is provided on the Y-axis slide 58 such that the X-axis slide 54 is movable in the X-axis direction. The Y-axis slide 58 is moved in the Y-axis direction by a Y-axis-slide moving device including a Y-axis servomotor as a drive source and a motion converting device which converts the rotation of the Y-axis servomotor into linear motion and transmits the linear motion to the Y-axis slide 58. Similarly, the X-axis slide 54 is moved in the X-axis direction by an X-axis-slide moving device including an X-axis servomotor as a drive source and a motion converting device which converts the rotation of the X-axis servomotor into linear motion and transmits the linear motion to the X-axis slide 54.

The EC mounting head 50 includes a rotating body 68 which is attached to the X-axis slide 54 such that the rotating body 68 is rotatable about a vertical axis line perpendicular to the horizontal plane. The rotation body 68 can be rotated by an arbitrary angle in each of opposite directions by a rotating device including a servomotor as a drive source. The above-described servomotors are electric rotary motors that can be accurately controlled with respect to rotation amount or angle and rotation velocity, and may be replaced with stepper motors.

The rotating body 68 supports a plurality of EC holders 72 that hold respective ECs, such that the EC holders 72 are equiangularly spaced from each other about the axis line of rotation of the rotating body 68. The EC holders 72 are fitted in respective holes formed in the rotating body 68, such that each of the EC holders 72 is movable in a direction (i.e., a Z-axis direction) parallel to the axis line of rotation of the rotating body 68, and is rotatable about its own axis line. When the rotating body 68 is rotated, the EC holders 72 are revolved about the axis line of rotation of the rotating body 68. When each of the EC holders 72 is moved in the Z-axis direction, the each holder 72 takes an EC from an appropriate one of the EC feeders 42 and mounts the EC on the PWB 32.

Figure 2:
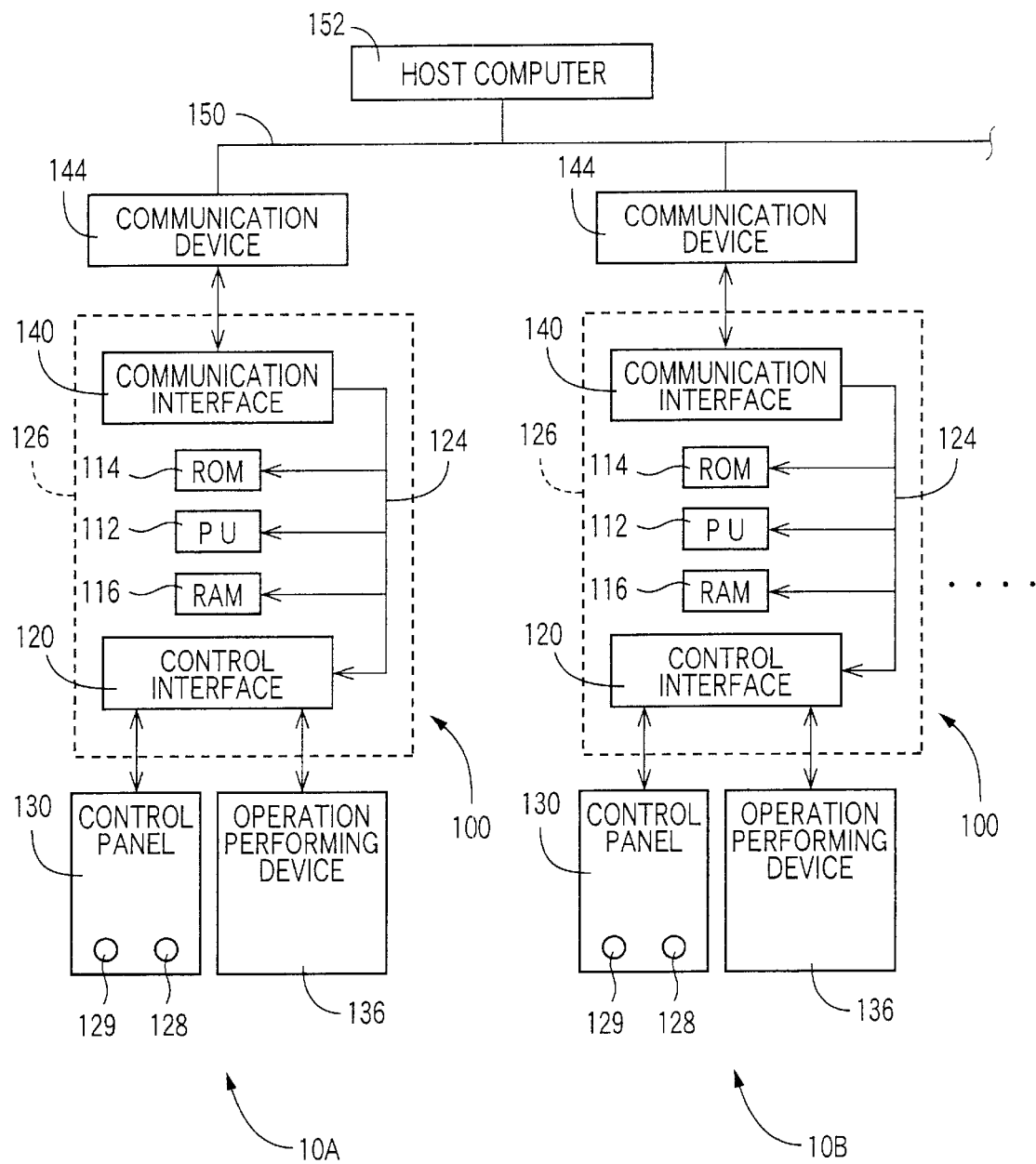
FIG. 2 is a block diagram illustrating respective relevant portions of a plurality of control devices employed by the electric-circuit board assembling line.

The EC mounting apparatus 10 constructed as described above includes a control device 100. As shown in FIG. 2, the control device 100 is essentially provided by a computer 126 including a PU (processing unit) 112, a ROM (read only memory) 114, a RAM (random access memory) 116, a control interface 120, and a bus 124 that connects those elements 112, 114, 116, 120 to one another. The control interface 120 is connected to a control panel 130 including (a) a keyboard having a start/stop switch 128, a master-control-device-designation start key 129, character keys (not shown), etc. that are operable by an operator, and (b) a display device that displays what information has been inputted by the operator, what state the EC mounting apparatus 10 is in, etc.; and an operation-performing device 136 including the above-described servomotors, image taking devices for taking respective images of the ECs held by the respective EC holders 72 of the mounting heads 50, 52, respective drive circuits for driving the servomotors and the image taking devices, etc. However, it could be said that the control device 100 includes, as part thereof, the above-indicated drive circuits. The ROM 114 stores programs used to control usual or common operations of the EC mounting apparatus 10. The RAM 116 stores programs and data that are needed to move, according to respective sorts of ECs, respective positions where those ECs are to be mounted, an order in which the ECs are mounted, etc., the mounting heads 50, 52, mount the ECs on the PWB 32, and thereby produce the printed circuit board.

The present electric-circuit board assembling line employs the plurality of EC mounting apparatuses 10 each of which is constructed as described above and which are arranged in one direction, i.e., the X-axis direction or the conveying direction. The control device 100 of each of the EC mounting apparatuses 10 additionally includes a communication interface 140 that is connected, on one hand, via the bus 124 to the PU 112, the ROM 114, and the RAM 116, and is connected, on the other hand, to a communication device 144. The respective control devices 100 of the EC mounting apparatuses 10 are independent of each other; and the respective control panels 130 or respective operation performing devices 136 of the EC mounting apparatuses 10 are independent of each other. In addition, the EC mounting apparatuses 10 include respective communication devices 144 that are connected to each other via a network 150 to send and receive information to and from each other. In the present embodiment, one of the respective control devices 100 of the EC mounting apparatuses operates as a master control device, and the remaining control devices 100 operate as slave control devices. The respective communication devices 144 of the EC mounting apparatuses 10 are also connected to a host computer 152. The host computer 152 stores a production planning including the respective sorts of printed circuit boards to be produced and the respective amounts of printed circuit boards of those sorts, and additionally stores the respective EC mounting programs needed to mount ECs on the printed circuit boards of those sorts. The host computer 152 sends a needed portion of the production planning and a needed one of the EC mounting programs, to the master control device.

All the respective control devices 100 of the EC mounting apparatuses 10 can operate in an identical manner, and accordingly each control device 100 can operate as each of a master control device and a slave control device. The respective ROMs 114 of all the control devices 100 store a program, represented by a flow chart shown in FIG. 3, for designating, as a master control device, one of all those control devices 100. The execution of this program is started upon operation of the master-control-device-designation start key 129. In FIG. 2, the EC mounting apparatuses 10 are distinguished from each other, for easier understanding purposes only, by letters, A, B, . . . , that are given in an order from the most upstream apparatus 10A toward the most downstream apparatus.

Figure 3:
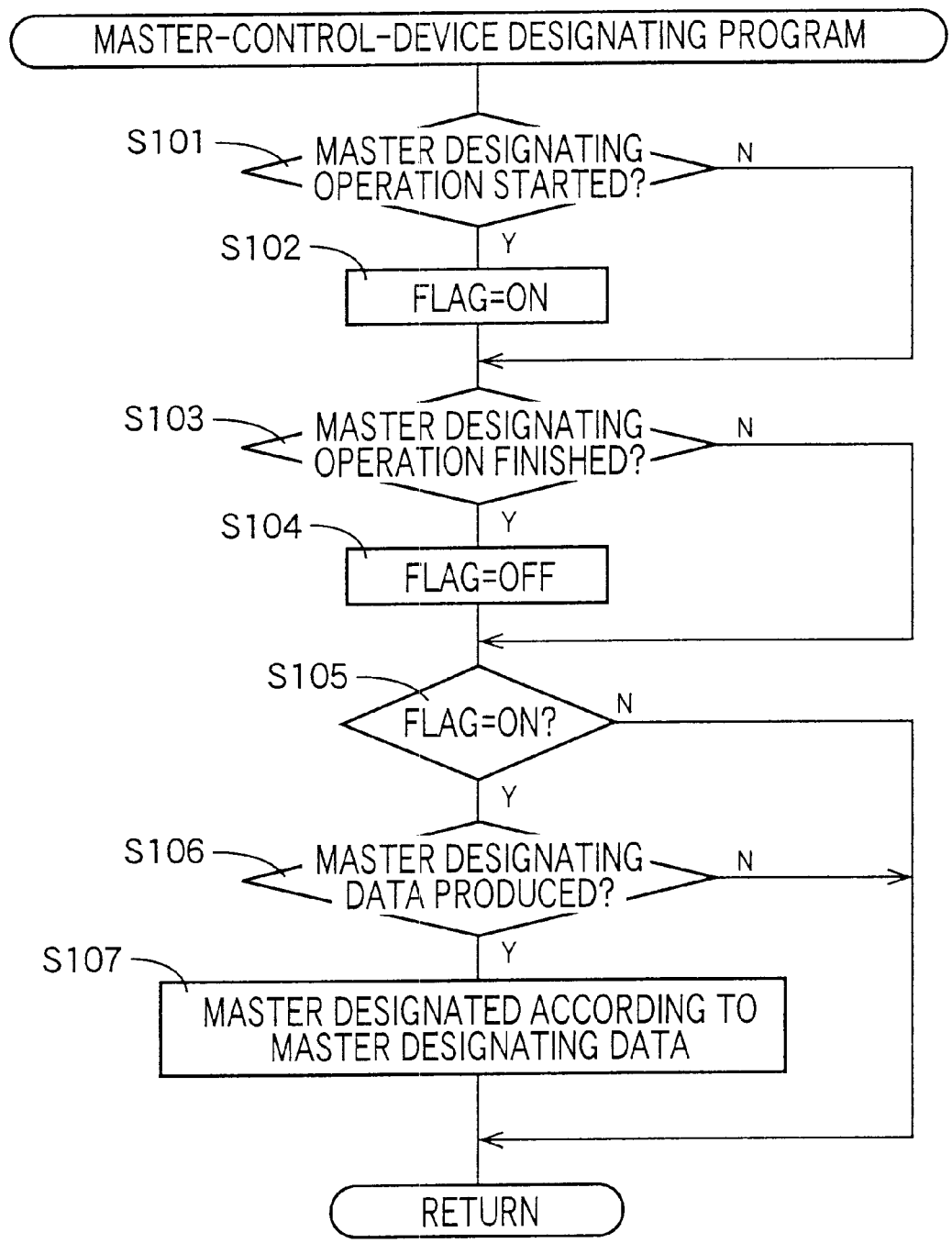
FIG. 3 is a flow chart representing a master-device designating routine that is stored in a ROM (read only memory) of each of the control devices.

In the master-control-device designating program represented by the flow chart shown in FIG. 3, first, at Step 101 (hereinafter, referred as "S101"; this applies to the following steps), the control device 100 judges whether a master-control-device designating operation has been started. The master-control-device designating operation is started when an operator pushes, for the first time, the master-control-device-designation start key 129. If a positive judgment is made at S101, the control goes to S102 to set a flag to flag=ON. In the present embodiment, when the master-control-device-designation start key 129 is operated for the first time, designation of a master control device is started and, when the start key 129 is operated for the second time, the designation of master control device is finished. On the other hand, if a negative judgment is made at S101, S102 is skipped and the control goes to S103 to judge whether the master-control-device designating operation has been finished. If a positive judgment is made at S103, the control goes to S104 to reset flag to flag=OFF. If this is the initial or first control cycle according to the flow chart of FIG. 3, the designating operation has not been finished and accordingly a negative judgment is made at S103, so that the control goes to S105. At S105, the control device judges whether flag is set at flag=ON. If a positive judgment is made at S105, the control goes to S106 to judge whether master-control-device designating data have been produced.

In the present embodiment, the master-control-device designating data mean data that are inputted, through the operator's operation of the keyboard, to designate, as a master control device, one of the respective control devices 100 of all the EC mounting apparatuses 10A, 10B, . . . . Here, it is assumed for easier understanding purposes only that the most upstream EC mounting apparatus 10A in the conveying direction is designated as the master control device. If a positive judgment is made at S106, the control goes to S107 to designate, according to the master-control-device designating data inputted by the operator, the control device 100 of the EC mounting apparatus 10A, as the master control device. On the other hand, if a negative judgment is made at S105, the control device skips S106 and the following step; and if a negative judgment is made at S106, the control device skips S107. The control device repeats the master-control-device designating program represented by the flow chart of FIG. 3. Eventually, the control device judges, at S103, whether the designation of master control device has been finished, after the master control device has been designated at S107. When, at this step, the operator pushes the master-control-device-designation start key 129, for the second time, a positive judgment is made at S103, so that the control goes to S104 to reset flag to flag=OFF. Thus, the designation of master control device is finished. That is, if the start key 129 is pushed by the operator in the state in which flag is set at ON, the designation of the master control device is confirmed or established. However, if the master-control-device designating data temporarily inputted by the operator are deleted before the start key 129 is pushed for the second time, the temporary designation of master control device can be canceled. Thus, an erroneous master-control-device designating operation can be avoided. However, each EC mounting apparatus 10 may be arranged to employ a confirming key and confirm, upon operator's operation of the confirming key, master-control-device designating data that have been inputted by the operator.

Figure 4:
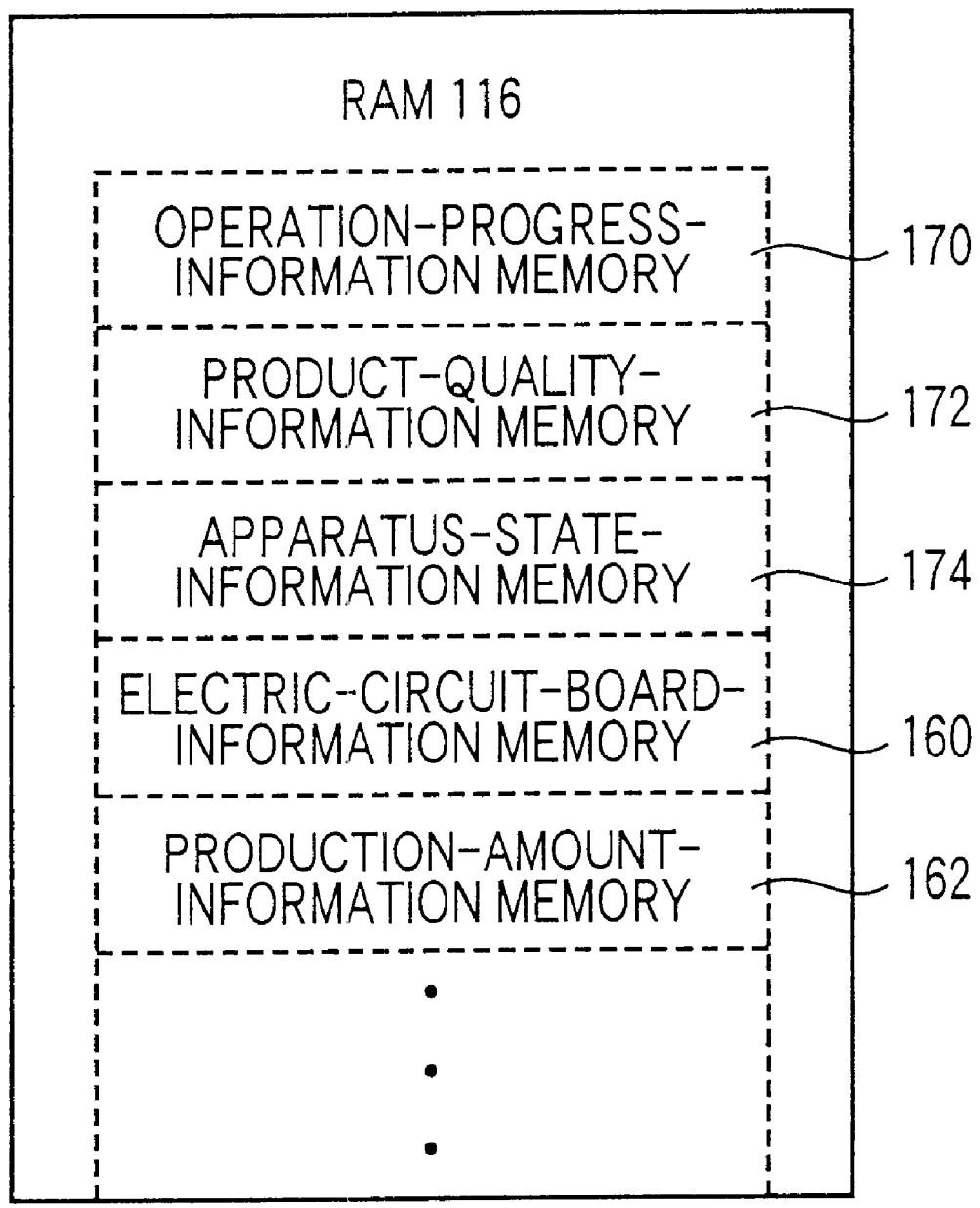
FIG. 4 is a view illustrating respective memory areas provided in a RAM (random access memory) of each of the control devices.

As shown in FIG. 4, the RAM 116 of each of the control devices 100 includes an electric-circuit-board-information memory 160 and a production-amount-information memory 162 which are host-information memories for storing information supplied from the host computer 152. The electric-circuit-board-information memory 160 stores information about the sort of printed circuit boards to be produced. The production-amount-information memory 162 stores information about the number of printed circuit boards to be produced, such that the number is related to the sort of the printed circuit boards to be produced. In addition, the RAM 116 additionally includes an operation-progress-information memory 170, a product-quality-information memory 172, and an apparatus-state-information memory 174 which are memories for storing, when this control device 100 operates as the master control device, slave information supplied from the other control devices 100 operating as the slave control devices. When the control device 100 of the EC mounting apparatus 10A is operated as the master control device, the operation-progress-information memory 170 of the RAM 116 of the master control device stores, in relation with each of the EC mounting apparatuses 10B, . . . , including the respective slave control devices 100, information about how many printed circuit boards each EC mounting apparatus has produced, and information about whether each EC mounting apparatus is now mounting ECs on a PWB 32 or has finished mounting ECs on a PWB 32. The product-quality-information memory 172 stores, in relation with each of the EC mounting apparatuses 10B, . . . , information about whether each of ECs held by each EC mounting apparatus has been found defective, and information about whether each EC has been safely mounted. The apparatus-state-information memory 174 stores, in relation with each of the EC mounting apparatuses 10B, . . . , information about whether each of the EC holders 72 of the each EC mounting apparatus has been found defective, and information about whether each of the EC feeders 42 of each EC mounting apparatus has become unable to supply any more ECs, or is about to become unable to supply any more ECs. It is natural that the operation-progress-information memory 170, the product-quality-information memory 172, and the apparatus-state-information memory 174 of the RAM 116 of the master control device should store, in relation with the EC mounting apparatus 10A including the master control device, the above-described sorts of information, respectively. Thus, the master control device controls not only the EC mounting apparatus 10A but also the other EC mounting apparatuses 10B, . . . including the respective slave control devices.

The ROM 114 of each of the control devices 100 stores, in addition to the master-control-device designating program, an electric-circuit-board assembling line controlling program to control the electric-circuit-board assembling line. The controlling program includes, as shown in FIG. 5, a master-control-device operating program or portion (i.e., a left-hand half portion shown in FIG. 5) for operating one of the respective control devices 100 of the EC mounting apparatuses 10, as a master control device, and a slave control-device operating program or portion (i.e., a right-hand half portion shown in FIG. 5) for operating the remaining control devices 100 as slave control devices.

Figure 5:
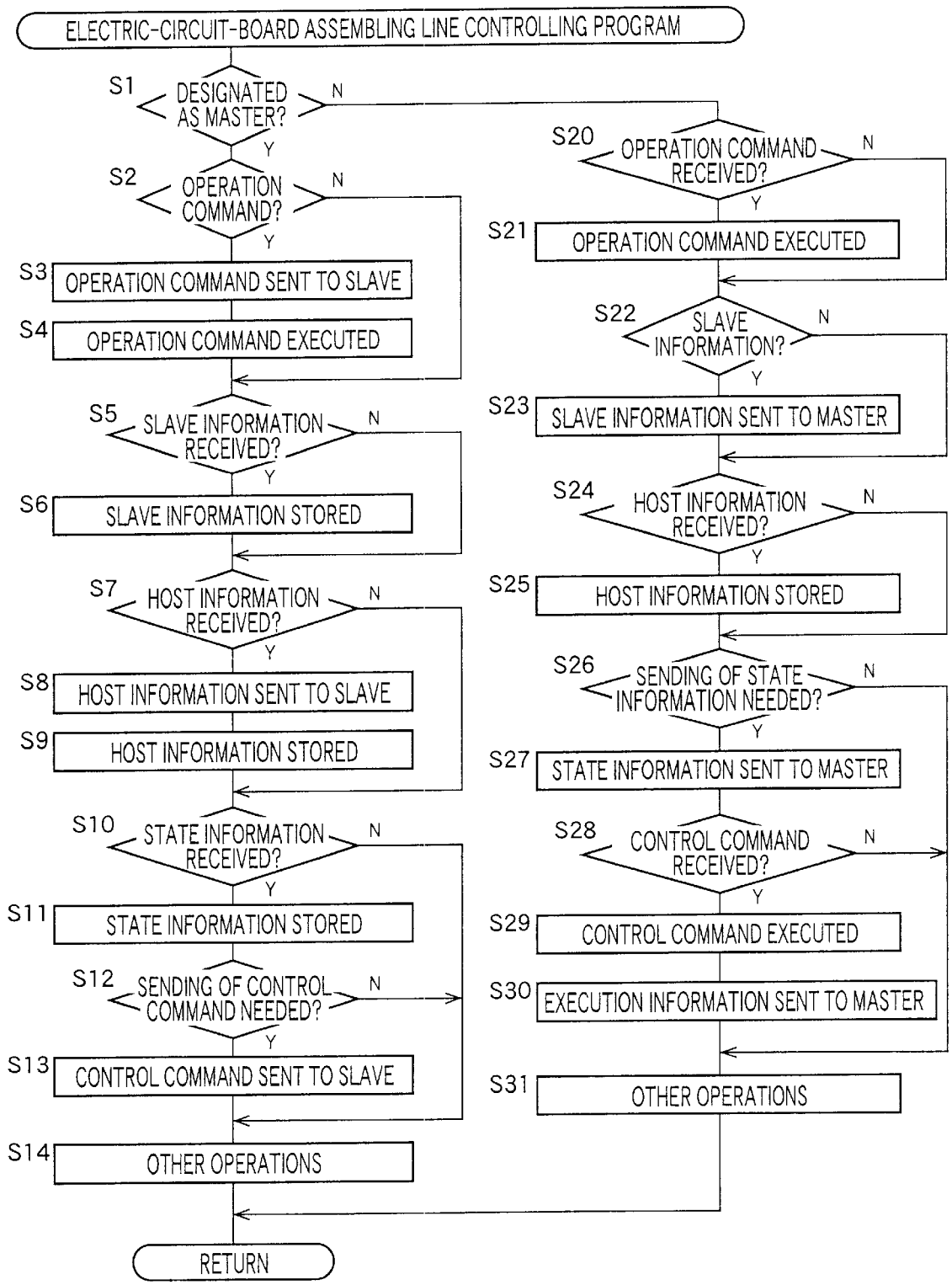
FIG. 5 is a flow chart representing an electric-circuit board assembling line controlling program that is stored in the ROM of each of the control devices.

Hereinafter, the operation of the master control device and the operation of each slave control device will be described by reference to the flow chart, shown in FIG. 5, representing the electric-circuit-board assembling line controlling program. As described above, each of the respective control devices 100 of the EC mounting apparatuses 10A, 10B, . . . can operate as a master control device. Here, it is assumed that the control device 100 of the EC mounting apparatus 10A operates as a master control device and the remaining control devices 100 of the other EC mounting apparatuses 10B, . . . operate as slave control devices. First, the operation of the master control device will be described by reference to the left-hand half portion of the flow chart of FIG. 5. At S1, the control device 100 of the EC mounting apparatus 10A judges whether the control device 100 itself has been designated as a master control device. Since here it is assumed that the control device 100 of the EC mounting apparatus 10A has been designated as a master control device, a positive judgment is made at S1, and the control goes to S2 to judge whether any of the keys including the start/stop key 128 has been operated by an operator to input any operation command. If a positive judgment is made at S2, the control goes to S3 to send the operation command inputted at S2, from the master control device to each of the slave control devices. Then, the control goes to S4 where the master control device controls the EC mounting apparatus 10A to execute the operation command. For example, if the start/stop key 128 has been operated by the operator at S2, the master control device sends a start/stop command to each of the slave control devices of the EC mounting apparatuses 10B, . . . , and starts or stops the EC mounting apparatus 10A. On the other hand, if a negative judgment is made at S2, then S3 and S4 are skipped, and S5 is executed.

At S5, the master control device judges whether the master control device has received, from each of the slave control devices of the respective EC mounting apparatuses 10B, . . . , a piece of slave information, i.e., a piece of operation-progress information (e.g., information about whether the each slave control device has automatically turned a start switch ON). If a positive judgment is made at S5, the control goes to S6 where the master control device stores, in the operation-progress-information memory 170 of the RAM 116 thereof, the respective pieces of received information such that those pieces of information are related to the respective EC mounting apparatuses 10B, . . . , including the respective slave control devices. In addition, the master control device stores, in the operation-progress-information memory 170 of the RAM 116 thereof, a piece of operation-progress information about the EC mounting apparatus 10A including the master control device. If a negative judgment is made at S5, S6 is skipped and S7 is executed. The control device 100 of the EC mounting apparatus 10A, designated as the master control device, receives, from the host computer 152, a piece of electric-circuit-board information about the sort of electric-circuit boards to be assembled, and a piece of production-amount information about the amount of production of the electric-circuit boards, and stores the piece of electric-circuit-board information and the piece of production-amount information in the electric-circuit-board-information memory 160 and the production-amount-information memory 162 of the RAM 116 of the control device 100, respectively. At S7, the master control device judges whether the master control device has received those pieces of information from the host computer 152. If a positive judgment is made at S7, the control goes to S8 where the master control device sends those pieces of information supplied from the host computer 152, to each of the slave control devices. Then, the control goes to S9 where the master control device stores those pieces of information in the electric-circuit-board-information memory 160 and the production-amount-information memory 162 of the RAM 116 thereof. On the other hand, if a negative judgment is made at S7, S8 and S9 are skipped, and the following steps are executed.

Next, the operation of each of the remaining control devices 100 of the other EC mounting apparatuses 10B, . . . designated as the slave control devices, will be described by reference to the right-hand half portion of the flow chart of FIG. 5. At S1, each of the control devices 100 of the remaining EC mounting apparatuses 10B, . . . judges whether each control device 100 itself has been designated as a master control device. Since here it is assumed that each control device 100 has been designated as a slave control device, a negative judgment is made at S1, and the control goes to S20 to judge whether the slave control device has received, from the master control device, any operation command inputted by the operator (i.e., whether any key on the EC mounting apparatus 10A including the master control device has been operated). If a positive judgment is made at S20, the control goes to S21 where the slave control device 100 controls the corresponding EC mounting apparatus 10B, . . . to perform the same operation as the operation that is performed by the apparatus 10A, . . . when a key of the apparatus 10B, . . . corresponding to the operated key of the apparatus 10A is operated. For example, if the start/stop key 128 of the apparatus 10A has been operated by the operator, the slave control device starts or stops the corresponding EC mounting apparatus 10B . . . On the other hand, if a negative judgment is made at S20, then S21 is skipped, and S22 is executed.

At S22, the slave control device judges whether there is any piece of slave information (e.g., information about whether the slave control device has automatically turned a start switch ON) that is to be sent to the master control device. If a positive judgment is made at S22, the control goes to S23 where the slave control device sends the piece of slave information to the master control device. On the other hand, if a negative judgment is made at S22, then S23 is skipped, and S24 is executed. At S24, the slave control device judges whether the slave control device has received, from the master control device, a piece of electric-circuit-board information and a piece of production-amount information supplied from the host computer 152. If a positive judgment is made at S24, the control goes to S25 where the slave control device stores the received pieces of information in the electric-circuit-board-information memory 160 and the production-amount-information memory 162 of the RAM 116 of the slave control device, respectively. On the other hand, if a negative judgment is made at S24, then S25 is skipped, and the following steps are executed.

Based on the electric-circuit-board information and production-amount information supplied from the host computer 152, the EC mounting apparatuses 10A, 10B, . . . are operated such that the EC mounting heads 50, 52 of the EC transferring and mounting devices 20, 22 of each EC mounting apparatus 10 take ECs from the EC supplying devices 16, 18 of each apparatus 10 and sequentially mount those ECs on a PWB 32. If one EC mounting apparatus 10 has finished mounting the ECs on the PWB 32, then the PWB 32 is conveyed to the next EC mounting apparatus 10 located downstream of the one EC mounting apparatus 10 in the conveying direction. During this EC mounting operation, the slave control device of each of the EC mounting apparatuses 10B, . . . sends, to the master control device, a piece of information about a state of each EC mounting apparatus 10B, . . . , together with information identifying each apparatus 10B, . . . . A piece of information about a state of the each EC mounting apparatus 10B, . . . includes information about how many printed circuit boards each EC mounting apparatus has produced; information about whether each apparatus is now mounting ECs on a PWB 32 or has finished mounting ECs on a PWB 32; information about whether each of ECs held by each apparatus has been found defective; information about whether each EC has been safely mounted; information about whether each of the EC holders 72 of each apparatus has been found defective; and information about whether each of the EC feeders 42 of each apparatus has become unable to supply any ECs, or is about to become unable to supply any ECs. Based on those pieces of information supplied from the slave control devices of the EC mounting apparatuses 10B, . . . , the master control device can control the electric-circuit board assembling line including the EC mounting apparatus 10A and the EC mounting apparatuses 10B, . . . .

At S10, the master control device judges whether the master control device has received, from the slave control devices, the above-described respective pieces of state information about the respective states of the EC mounting apparatuses 10B, . . . . If a positive judgment is made at S10, the control goes to S11 where the master control device divides the received pieces of state information into the previously-described three sorts of information, i.e., the pieces of operation-progress information, the pieces of product-quality information and the pieces of apparatus-state information, and stores those sorts of information in the corresponding slave-information memories (i.e., the operation-progress-information memory 170, the product-quality-information memory 172, and the apparatus-state-information memory 174). Then, the control goes to S12 to judge, based on the pieces of state information received at S10, whether the master control device needs to send any control command to any one of the slave control devices. For example, if one EC mounting apparatus 10 has failed to mount an EC on a PWB 32, thereby producing a defective PWB 32, then the master control device needs to send a control command to all the slave control devices. In this case, a positive judgment is made at S12, and the control goes to S13 where the master control device sends a control command to all the slave control devices. More specifically described, to each of the respective slave control devices of the EC mounting apparatuses 10 located downstream of the EC mounting apparatus 10 that has failed to mount an EC, the master control device sends a control command to inhibit those downstream apparatuses 10 from mounting ECs on the defective PWB 32; and, to each of the respective slave control devices of the EC mounting apparatuses 10 located upstream of the EC mounting apparatus 10 that has failed, the master control device sends a control command to operate those upstream apparatuses 10 to mount ECs on one more PWB 32. Thus, the defective PWB 32 is discarded without any more ECs being mounted. However, since the assembling line conveys one more PWB 32 than the prescribed number of PWBs 32, finally, the assembling line produces the prescribed number of printed circuit boards. S13 is followed by S14 where the master control device performs other operations in relation with the electric-circuit-board assembling operation. On the other hand, if a negative judgment is made at S10, S11, S12 and S13 are skipped; and if a negative judgment is made at S12, S13 is skipped. In either case, then the master control device executes S14.

Meanwhile, each of the slave control devices judges, at S26 of the right-hand half portion of the flow chart of FIG. 5, whether there is any piece of state information to be sent from the each slave control device to the master control device. If a positive judgment is made at S26, then the control goes to S27 where the slave control device sends the piece of state information to the mater control device. S27 is followed by S28 to judge whether the slave control device has received any control command from the master control device. If a positive judgment is made at S28, the control goes to S29 where the slave control device executes the control command, and then goes to S30 where the slave control device sends, to the master control device, execution information indicating that the slave control device has executed the control command. S30 is followed by S31 where the slave control device performs other operations. On the other hand, if a negative judgment is made at S26, S27 to S30 are skipped; and if a negative judgment is made at S28, S29 and S30 are skipped. In either case, then the slave control device executes S31. While the master control device and the slave control devices repeat the above-described steps, the EC mounting apparatuses 10A, 10B, . . . successively assemble ECs and PWBs 32 into printed circuit boards.

At S12 of FIG. 5, the master control device may need to send a control command to one or more appropriate slave control devices, for example, when one of the EC mounting apparatuses including the respective slave control devices has become unable to supply (or mount) a certain sort of ECs. In the case where one EC mounting apparatus employs a plurality of EC feeders 42 that are arranged to supply a same sort of ECs, if a first one of those EC feeders 42 has become unable to supply any more ECs, then the slave control device of the EC mounting apparatus operates a second one of the EC feeders 42 to supply ECs in place of the first EC feeder 42. However, if one EC mounting apparatus has only a single EC feeder 42 that is arranged to supply a certain sort of ECs and the single EC feeder 42 has supplied all the ECs, or if one EC mounting apparatus has a plurality of EC feeders 42 that is arranged to supply a certain sort of ECs and all those EC feeders 42 have supplied all the ECs, the one EC mounting apparatus sends, to the master control device, a piece of state information indicating that the one EC mounting apparatus has become unable to supply that sort of ECs. Based on the piece of state information, the master control device sends a control command to, if any, the slave control device of another EC mounting apparatus that can supply that sort of ECs, so that the slave control device controls the another or second apparatus to supply the ECs in place of the one or first apparatus.

That is, the master control device monitors or manages the operation of the electric-circuit-board assembling line as a whole, while judging whether the respective EC mounting apparatuses 10 of the assembling line are performing the respective EC mounting operations according to the production planning supplied from the host computer 152. When a problem occurs, the master control device sends, to the slave control devices, a control command to address the problem. In contrast, each of the slave control devices controls, according to various commands supplied from the master control device, the corresponding EC mounting apparatus to mount ECs on a PWB 32, and sends, to the master control device, execution information indicating that those commands have been executed, and state information about the state of the corresponding EC mounting apparatus. The communication device 144 of each of the EC mounting apparatuses 10 takes in only information that is related to the each EC mounting apparatus 10, so that the taken information may be used by the control device 100 of the each apparatus 10. Therefore, though the host computer 152 is connected to all the respective communication devices 144 of the EC mounting apparatuses 10, only the communication device 144 connected to the master control device takes in the information supplied from the host computer 152, so that the taken information may be used by the master control device, and each of the respective communication devices 144 connected to the slave control devices takes in only the information supplied from the master control device. In addition, the slave control devices send all information to the master control device, so that the master control device can monitor the respective states of all the EC mounting apparatuses. Therefore, the operator needs to operate the master control device only, and need not operate the slave control devices. Thus, the efficiency of operation of the operator is improved, and the electric-circuit board assembling line can be easily controlled. Moreover, since the master control device automatically monitors and controls the EC mounting apparatuses, the efficiency of production of the electric-circuit board assembling line is improved.

The foregoing description relates to the case where the control device 100 of the EC mounting apparatus 10A operates as the master control device. However, since each of the respective control devices 100 of all the EC mounting apparatuses 10 stores both the master-control-device operating program or portion and the slave-control-device operating program or portion, each control device 100 can operate as each of a master control device and a slave control device. Therefore, depending upon the circumstances, such as the production planning, any control device 100 other than the control device 100 of the EC mounting apparatus 10A may be operated as the master control device. For example, if the control device 100 of the EC mounting apparatus 10A that has been used as a master control device has broken down, then the control device 100 of the EC mounting apparatus 10B that has been used as a slave control device may be operated as a master control device, and the EC mounting apparatus 10A may be removed from the electric-circuit-board assembling line, so as to continue the electric-circuit-board assembling or producing operation.

In the present embodiment, the plurality of EC mounting apparatuses 10 provide a plurality of electric-circuit-board-assembling-related apparatuses of the electric-circuit-board assembling line. That is, in the present embodiment, all the electric-circuit-board-assembling-related apparatuses are provided by the EC mounting apparatuses 10. However, in another embodiment of the present invention, at least one of the screen printing system 11 as the upstream-side apparatus and the solder reflowing system 13 as the downstream-side apparatus may be additionally connected to the network 150 including the EC mounting apparatuses 10, so as to provide another electric-circuit-board assembling line. Moreover, it is possible to provide yet another electric-circuit-board assembling line including one or more different sorts of electric-circuit-board-assembling-related apparatuses.

In the illustrated embodiment, the ROM 114 of each of the control devices 100 stores the master-control-device designating program and the master-control-device and slave-control-device operating programs, and accordingly provides a recording medium for recording the electric-circuit-board assembling line controlling program such that the controlling program is readable and executable by the computer 126. However, it is possible to record the electric-circuit-board assembling line controlling program on a recording medium, such as a floppy disk, that can be easily removed from each of the control devices 100. In the latter case, the each control device 100 is provided with a reading device which can read the program from the recording medium.

In the illustrated embodiment, the master control device supplies each sort of information or each sort of command directly to each of the two or more slave control devices. However, the master control device may be arranged to supply the information or command to one of two slave control devices, and the one slave control device may be arranged to supply the information or command to the other slave control device. In the latter case, the master control device supplies the information or command indirectly to the other slave control device.

While some embodiments of this invention and some modifications thereof have been described in detail, for illustrative purposes only, it is to be understood that the present invention may be embodied with various other changes, modifications and improvements, such as those described in SUMMARY OF THE INVENTION, which may occur to a person skilled in the art, without departing from the spirit and scope of the invention defined in the appended claims.

What is claimed is:

1. An electric-circuit board assembling line, comprising:
a plurality of electric-circuit-board-assembling-related apparatuses which include respective control devices independent of each other and which perform respective electric-circuit-board-assembling-related operations that are related to assembling of an electric-circuit board including a substrate board and at least one electric component mounted thereon, the respective control devices of the electric-circuit-board-assembling-related apparatuses including a master control device, and at least one slave control device subject to the master control device;

at least one communication device which connects the master control device and the slave control device, to each other; and at least one of (a) the master control device being operable to control the electric-circuit-board-assembling-related apparatus including the slave control device, (b) the master control device supplying, to the slave control device, information about the electric-circuit board to be assembled, and (c) the slave control device supplying, to the master control device, information about a state of the electric-circuit-board-assembling-related apparatus including the slave control device, so that the master control device recognizes said state, wherein the slave control device as a first slave control device is capable of operating as a second master control device, and the master control device as a first master control device is capable of operating as a second slave control device subject to the second master control device.

2. An electric-circuit board assembling line according to claim 1, wherein each of the respective control devices of the electric-circuit-board-assembling-related apparatuses is capable of operating as each of a master control device and a slave control device.

3. An electric-circuit board assembling line according to claim 1, wherein each one of the respective control devices of the electric-circuit-board-assembling-related apparatuses performs a plurality of operations identical with a plurality of operations that are performed by each of the other control devices of the electric-circuit-board-assembling-related apparatuses.

4. An electric-circuit board assembling line according to claim 1, wherein the electric-circuit-board-assembling-related apparatuses comprise a plurality of electric-component mounting apparatuses each of which mounts at least one electric component on the substrate board.

5. An electric-circuit board assembling line according to claim 1, wherein the slave control device supplies, to the master control device, information about a state of the electric-circuit-board-assembling-related apparatus including the slave control device, and the master control device controls, based on the supplied information, the electric-circuit-board-assembling-related apparatus including the master control device and the electric-circuit-board-assembling-related apparatus including the slave control device.

6. An electric-circuit board assembling line according to claim 1, wherein the master control device supplies, to the slave control device, information about the substrate board.

7. An electric-circuit board assembling line according to claim 1, wherein the respective control devices of the electric-circuit-board-assembling-related apparatuses include at least two slave control devices subject to the master control device, and wherein the master control device supplies, to one of the two slave control devices, information about the substrate board, and said one slave control device supplies, to the other slave control device, the information about the substrate board.

8. A method of assembling an electric-circuit board with an electric-circuit board assembling line including a plurality of electric-circuit-board-assembling-related apparatuses which include respective control devices independent of each other and which perform respective electric-circuit-board-assembling-related operations on a substrate board, for assembling of the electric-circuit board including the substrate board and at least one electric component mounted thereon, the method comprising the steps of:

operating a first one of the respective control devices of the electric-circuit-board-assembling-related apparatuses as a first master control device, and operating a second one of said respective control devices as a first slave control device subject to the first master control device, subsequently operating the second control device as a second master control device, and operating the first control device as a second slave control device subject to the second master control device, and at least one of (a) operating each of the first and second master control devices to control the electric-circuit-board-assembling-related apparatus including a corresponding one of the first and second slave control devices, (b) supplying, from each of the first and second master control devices to a corresponding one of the first and second slave control devices, information about the electric-circuit board to be assembled, and (c) supplying, from each of the first and second slave control devices to a corresponding one of the first and second master control devices, information about a state of the electric-circuit-board-assembling-related apparatus including said each slave control device, so that said one master control device recognizes said state.

9. An electric-circuit board assembling line controlling program which is executed by a computer to control an electric-circuit board assembling line including a plurality of electric-circuit-board-assembling-related apparatuses which include respective control devices independent of each other and which perform respective electric-circuit-board-assembling-related operations on a substrate board, for assembling of an electric-circuit board including the substrate board and at least one electric component mounted thereon, the program comprising:

a master-control-device operating portion for operating a first one of the respective control devices of the electric-circuit-board-assembling-related apparatuses, as a first master control device, and subsequently operating a second one of the respective control devices as a second master control device, a slave-control-device operating portion for operating the second control device as a first slave control device subject to the first master control device, and subsequently operating the first control device as a second slave control device subject to the second master control device, for at least one of (a) operating each of the first and second master control devices to control the electric-circuit-board-assembling-related apparatus including a corresponding one of the first and second slave control devices, (b) supplying, from each of the first and second master control devices to a corresponding one of the first and second slave control devices, information about the electric-circuit board to be assembled, and (c) supplying, from each of the first and second slave control devices to a corresponding one of the first and second master control devices, information about a state of the electric-circuit-board-assembling-related apparatus including said each slave control device, so that said one master control device recognizes said state.

10. An electric-circuit board assembling line controlling program according to claim 9, wherein the master-control-device operating portion is capable of operating each one of the respective control devices of the electric-circuit-board-assembling-related apparatuses, as a master control device, and the slave-control-device operating portion is capable of operating said each one of the respective control devices as a slave control device subject to the master control device.

11. A recording medium for recording an electric-circuit board assembling line controlling program such that the program is readable by a computer to control an electric-circuit board assembling line including a plurality of electric-circuit-board-assembling-related apparatuses which include respective control devices independent of each other and which perform respective electric-circuit-board-assembling-related operations on a substrate board, for assembling of an electric-circuit board including the substrate board and at least one electric component mounted thereon, the program comprising:

a master-control-device operating portion for operating a first one of the respective control devices of the electric-circuit-board-assembling-related apparatuses, as a first master control device, and subsequently operating a second one of the respective control devices as a second master control device, a slave-control-device operating portion for operating the second control device as a first slave control device subject to the first master control device, and subsequently operating the first control device as a second slave control device subject to the second master control device, for at least one of (a) operating each of the first and second master control devices to control the electric-circuit-board-assembling-related apparatus including a corresponding one of the first and second slave control devices, (b) supplying, from each of the first and second master control devices to a corresponding one of the first and second slave control devices, information about the electric-circuit board to be assembled, and (c) supplying, from each of the first and second slave control devices to a corresponding one of the first and second master control devices, information about a state of the electric-circuit-board-assembling-related apparatus including said each slave control device, so that said one master control device recognizes said state.

12. The electric-circuit board assembling line according to claim 1, wherein the plurality of electric-circuit-board-assembling-related apparatuses comprise at least one electric-component mounting device which mounts said at least one electric component on the substrate board, and at least one of (a) a solder applying apparatus which applies a solder paste to the substrate board and (b) a solder reflowing apparatus which reflows a solder paste applied to the substrate board.

13. The electric-circuit board assembling line according to claim 1, wherein the plurality of electric-circuit-board-assembling-related apparatuses perform the respective electric-circuit-board-assembling-related operations on the substrate board.

\* \* \* \* \*